(12) United States Patent
Jeong et al.

(10) Patent No.: US 10,950,279 B2
(45) Date of Patent: Mar. 16, 2021

(54) BIT LINE SENSE AMPLIFIER CIRCUIT CAPABLE OF REDUCING OFFSET VOLTAGE

(71) Applicants: SK hynix Inc., Icheon (KR); Seoul National University R&DB Foundation, Seoul (KR)

(72) Inventors: Deog-Kyoon Jeong, Seoul (KR); Jung Min Yoon, Seoul (KR); Hyungrok Do, Seoul (KR); Dae-Hyun Koh, Incheon (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/545,805

(22) Filed: Aug. 20, 2019

(65) Prior Publication Data

US 2020/0075065 A1 Mar. 5, 2020

(30) Foreign Application Priority Data

Aug. 28, 2018 (KR) .......................... 10-2018-0101386

(51) Int. Cl.
*G11C 7/06* (2006.01)
*G11C 11/22* (2006.01)
*H03F 3/16* (2006.01)
*H03F 1/02* (2006.01)

(52) U.S. Cl.
CPC .......... *G11C 7/065* (2013.01); *G11C 11/2273* (2013.01); *H03F 1/0205* (2013.01); *H03F 3/16* (2013.01)

(58) Field of Classification Search
CPC . G11C 7/065; G11C 11/2273; G11C 11/4091; H03F 3/16; H03F 1/0205
See application file for complete search history.

(56) References Cited

U.S. PATENT DOCUMENTS

| 10,043,566 B2 * | 8/2018 | Ingalls ................ G11C 11/2275 |
| 10,163,481 B1 * | 12/2018 | Vimercati ............ G11C 11/221 |
| 2009/0040810 A1 * | 2/2009 | Forbes ................ G11C 11/4091 |
| | | 365/149 |

(Continued)

OTHER PUBLICATIONS

Moon, et al., "Sense Amplifier with Offset Mismatch Calibration for Sub 1-V DRAM Core Operation", 2010 IEEE, p. 3501-p. 3504.

(Continued)

*Primary Examiner* — David Lam

(57) ABSTRACT

A BLSA circuit includes a first inverter disposed between a first sensing node and a second inner bit line, a second inverter disposed between a second sensing node and a first inner bit line, a first capacitor disposed between a first bit line and the first sensing node, a second capacitor disposed between a second bit line and the second sensing node, a first offset canceling switch for electrically coupling the first inner bit line with the second sensing node during an offset canceling operation, a second offset canceling switch for electrically coupling the second inner bit line with the first sensing node during the offset canceling operation, a first isolation switch for electrically coupling the first bit line with the first inner bit line, and a second isolation switch for electrically coupling the second bit line with the second inner bit line.

16 Claims, 5 Drawing Sheets

(56) References Cited

U.S. PATENT DOCUMENTS

2017/0236563 A1    8/2017   Glazewski et al.

OTHER PUBLICATIONS

Jung Ming Yoon et al. "A Capacitor-Coupled Offset-Canceled Sense Amplifier for DRAMs With Reduced Variation of Decision Threshold Voltage," IEEE Journal of Solid-State Cirkuits, Mar. 5, 2020, p. 1-p. 9, Seoul National University.

* cited by examiner

BIT LINE SENSE AMPLIFIER CIRCUIT CAPABLE OF REDUCING OFFSET VOLTAGE

CROSS-REFERENCE TO RELATED APPLICATION

This application claims priority under 35 U.S.C. § 119 to Korean Patent Application No. 10-2018-0101386 filed on Aug. 28, 2018, which is incorporated herein by reference in its entirety.

BACKGROUND

1. Field

This patent document relates to circuit design technology, and more particularly, to a bit line sense amplifier circuit.

2. Discussion of the Related Art

Basically, a memory device writes therein data inputted from outside, and reads data stored (written) therein. A basic unit for storing data is referred to as a cell, and the memory device includes a plurality of cells. A cell includes one capacitor to store one data. In order to read the data stored in the capacitor and correctly transfer the read data to the outside, the memory device needs to accurately determine the polarity of the data stored in the cell. The memory device includes a bit line sense amplifier (BSLA) as an amplifier circuit for amplifying the data stored in the cell and determining the polarity of the data.

FIG. 1 illustrates a conventional BLSA circuit 100.

Referring to FIG. 1, the BLSA circuit 100 includes first and second inverters 110 and 120 cross-coupled between first and second bit lines BLT and BLB. For convenience of description, FIG. 1 illustrates a memory cell CELL11 coupled to the first bit line BLT, a memory cell CELL12 coupled to the second bit line BLB, and the BLSA circuit 100 coupled to the first and second memory cells CELL11 and CELL12.

Before the BLSA circuit 100 is activated, the bit line pair BLT and BLB may be precharged with the same level. Then, when a word line, e.g., a zeroth word line WL0 coupled to the memory cell CELL11, is enabled, a charge sharing operation may be performed between the bit line pair BLT and BLB while data stored in a capacitor C11 of the memory cell CELL11 is read out to the first bit line BLT through a channel of a cell transistor T11 of the memory cell CELL11 coupled to the zeroth word line WL0. Through the charge sharing operation, a voltage level of the first bit line BLT may become slightly higher or lower than a precharge voltage level according to a logic value of the data stored in the capacitor C11. At this time, the second bit line BLB may retain the precharge voltage level as it is.

After the charge sharing operation, a pull-up voltage may be supplied to a pull-up voltage terminal RTO of the BLSA circuit 100 and a pull-down voltage may be supplied to a pull-down voltage terminal SB of the BLSA circuit 100, thereby activating the BLSA circuit 100. As being activated, the BLSA circuit 100 may recognize a voltage difference between the first and second bit lines BLT and BLB, and amplify the voltage difference, such that a higher voltage of the first and second bit lines BLT and BLB is amplified into a much higher voltage corresponding to the pull-up voltage and a lower voltage of the first and second bit lines BLT and BLB is amplified into a much lower voltage corresponding to the pull-down voltage.

Ideally, even though a slight voltage difference dV is present between the bit line pair BL and BLB, the BLSA circuit 100 should accurately sense and amplify the voltage difference dV. In reality, however, the BLSA circuit 100 may not accurately sense and amplify the slight voltage difference dV. The minimum value of the voltage difference dV between the bit line pair BLT and BLB that the BLSA circuit 100 accurately senses is referred to as an offset voltage. When the voltage difference dV between the bit line pair BLT and BLB is smaller than the offset voltage, the BLSA circuit 100 may not perform an accurate amplification and sensing operation.

A factor causing the voltage difference dV to be smaller than the offset voltage may include a mismatch between the inverters 110 and 120. The inverters 110 and 120 in charge of sensing and amplification include PMOS transistors 111 and 121 and NMOS transistors 112 and 122, which need to be manufactured to have same characteristics. In reality, however, the mismatch may be always present due to a problem that the layout of the inverters 110 and 120 is not symmetrically drawn with precision, a problem that patterns for forming the transistors are not identically formed even though the layout was symmetrically drawn, and/or a problem that contacts among the transistors are not identically defined.

SUMMARY

Various embodiments are directed to a BLSA circuit capable of reducing an offset voltage.

In an embodiment, a BLSA circuit may include: a first inverter having an input terminal coupled to a first sensing node and an output terminal coupled to a second inner bit line; a second inverter having an input terminal coupled to a second sensing node and an output terminal coupled to a first inner bit line; a first capacitor coupled to and disposed between a first bit line and the first sensing node; a second capacitor coupled to and disposed between a second bit line and the second sensing node; a first offset canceling switch suitable for electrically coupling the first inner bit line with the second sensing node during an offset canceling operation; a second offset canceling switch suitable for electrically coupling the second inner bit line with the first sensing node during the offset canceling operation; a first isolation switch suitable for electrically coupling the first bit line with the first inner bit line; and a second isolation switch suitable for electrically coupling the second bit line with the second inner bit line.

DETAILED DESCRIPTION

Figure 1:
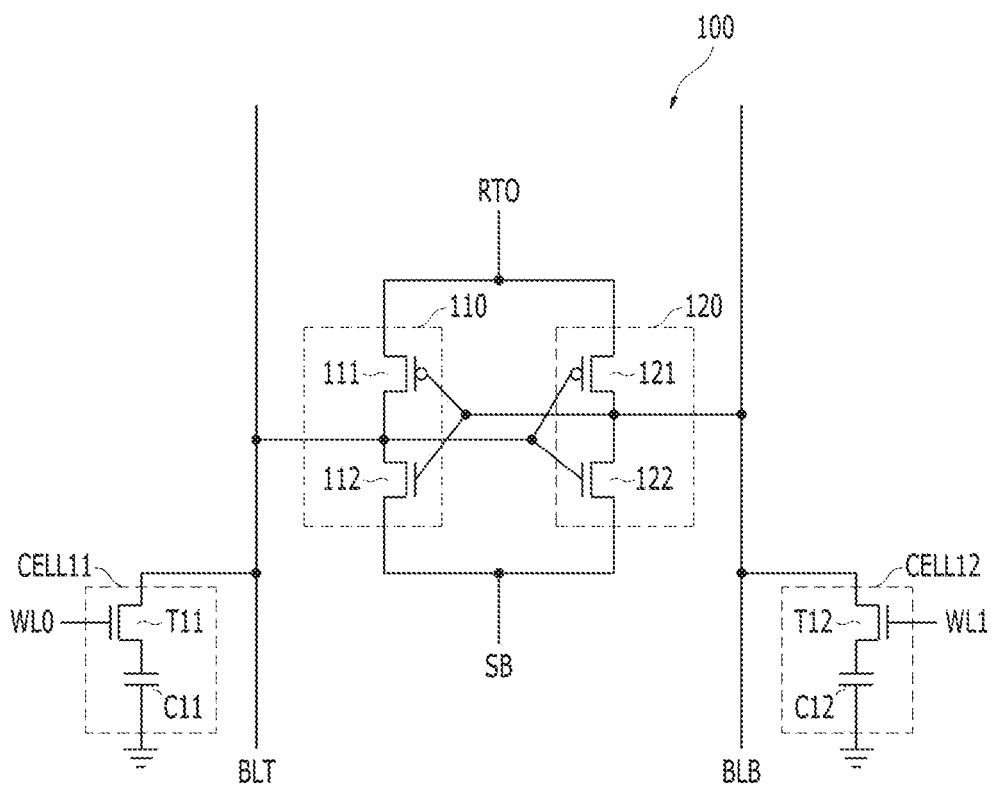
FIG. 1 illustrates a conventional bit line sense amplifier (BLSA) circuit.

Various embodiments will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art. Moreover, detailed descriptions related to well-known functions or configurations will be omitted in order to clearly describe the subject matters of the present disclosure. Throughout the disclosure, like reference numerals refer to like parts throughout the various figures and embodiments.

Figure 2A:
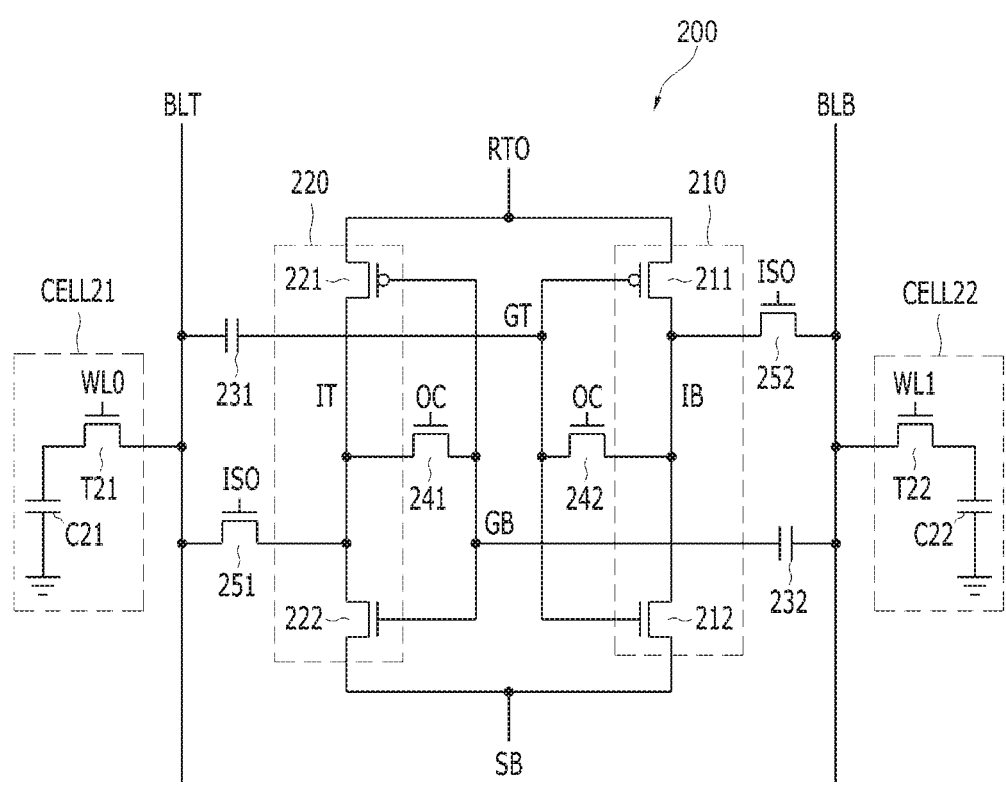
FIG. 2A illustrates a BLSA circuit in accordance with an embodiment.

FIG. 2A illustrates a BLSA circuit 200 in accordance with an embodiment. For convenience of description, FIG. 2A further illustrates a memory cell CELL21 coupled to a first bit line BLT, and a memory cell CELL22 coupled to a second bit line BLB. The BLSA circuit 200 is coupled between the first bit line BLT and the second bit line BLB.

Referring to FIG. 2A, the BLSA circuit 200 may include a first inverter 210, a second inverter 220, a first capacitor 231, a second capacitor 232, a first offset canceling switch 241, a second offset canceling switch 242, a first isolation switch 251, and a second isolation switch 252.

The first inverter 210 may have an input terminal coupled to a first sensing node GT and an output terminal coupled to a second inner bit line IB. The second inverter 220 may have an input terminal coupled to a second sensing node GB and an output terminal coupled to a first inner bit line IT. The first inverter 210 may include a PMOS transistor 211 and an NMOS transistor 212. The second inverter 220 may include a PMOS transistor 221 and an NMOS transistor 222.

The first capacitor 231 may be coupled to and disposed between the first bit line BLT and the first sensing node GT, and the second capacitor 232 may be coupled to and disposed between the second bit line BLB and the second sensing node GB. The first and second capacitors 231 and 232 may serve to store offsets of the first and second inverters 210 and 220 during an offset canceling operation. Since the offsets of the first and second inverters 210 and 220 are stored in the first and second capacitors 231 and 232, the offsets of the first and second inverters 210 and 220 may be accurately stored even though lengths or loadings of the first and second bit lines BLT and BLB are different from each other.

The first offset canceling switch 241 may electrically couple the first inner bit line IT with the second sensing node GB in response to an offset canceling signal OC. The second offset canceling switch 242 may electrically couple the second inner bit line IB with the first sensing node GT in response to the offset canceling signal OC. Each of the first and second offset canceling switches 241 and 242 may include an NMOS transistor.

The first isolation switch 251 may electrically couple the first bit line BLT with the first inner bit line IT in response to an isolation signal ISO. The second isolation switch 252 may electrically couple the second bit line BLB with the second inner bit line IB in response to the isolation signal ISO. Each of the first and second isolation switches 251 and 252 may include an NMOS transistor.

Figure 2B:
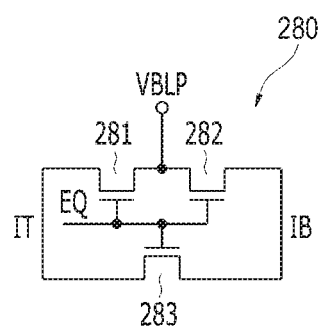
FIG. 2B illustrates a precharge circuit for precharging the BLSA circuit shown in FIG. 2A in accordance with an embodiment.

FIG. 2B illustrates a precharge circuit 280 for precharging the BLSA circuit 200 shown in FIG. 2A in accordance with an embodiment. The precharge circuit 280 may apply a bit line precharge voltage VBLP to the first and second inner bit lines IT and IB when an equalizing signal EQ is enabled. A level of the bit line precharge voltage VBLP may correspond to an intermediate level between a ground voltage and a core voltage VCORE. The precharge circuit 280 may include three NMOS transistors 281 to 283. The NMOS transistors 281 and 282 are connected in series between the first and second inner bit lines IT and IB. A common node of the NMOS transistors 281 and 282 is connected to a terminal of the bit line precharge voltage VBLP. The NMOS transistor 283 is coupled to and disposed between the first and second inner bit lines IT and IB. The NMOS transistors 281 to 283 have gates to which the equalizing signal EQ is applied.

Figure 2C:
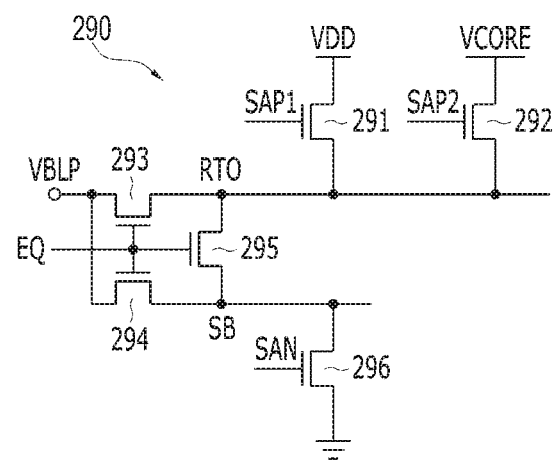
FIG. 2C illustrates a BLSA driving circuit for driving the BLSA circuit shown in FIG. 2A in accordance with an embodiment.

FIG. 2C illustrates a BLSA driving circuit 290 for driving the BLSA circuit 200 shown in FIG. 2A in accordance with an embodiment. The BLSA driving circuit 290 may apply the bit line precharge voltage VBLP to a pull-up voltage terminal RTO and a pull-down voltage terminal SB when the equalizing signal EQ is enabled. The BLSA driving circuit 290 may apply a power supply voltage VDD to the pull-up voltage terminal RTO when a first pull-up voltage supply signal SAP1 is enabled, and apply the core voltage VCORE to the pull-up voltage terminal RTO when a second pull-up voltage supply signal SAP2 is enabled. The BLSA driving circuit 290 may apply the ground voltage to the pull-down voltage terminal SB when a pull-down voltage supply signal SAN is enabled. The core voltage VCORE may have a lower level than the power supply voltage VDD.

The BLSA driving circuit 290 may include NMOS transistors 291 to 296. The NMOS transistor 291 applies the power supply voltage VDD to the pull-up voltage terminal RTO in response to the first pull-up voltage supply signal SAP1. The NMOA transistor 292 applies the core voltage VCORE to the pull-up voltage terminal RTO in response to the second pull-up voltage supply signal SAP2. The NMOS transistors 293 and 294 apply the bit line precharge voltage VBLP to the pull-up voltage terminal RTO and the pull-down voltage terminal SB, respectively, in response to the equalizing signal EQ. The NMOA transistor 295 couples the pull-up voltage terminal RTO with the pull-down voltage terminal SB in response to the equalizing signal EQ. The NMOA transistor 296 applies the ground voltage to the pull-down voltage terminal SB in response to the pull-down voltage supply signal SAN.

Figure 3:
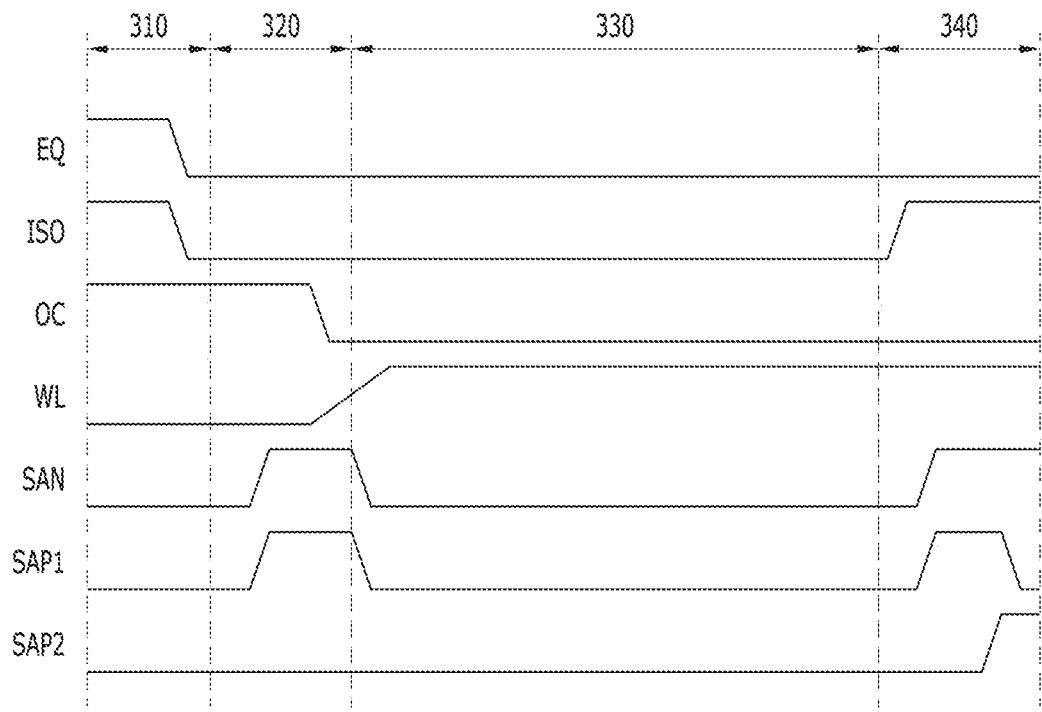
FIG. 3 is a timing diagram illustrating an operation of the BLSA circuit shown in FIG. 2A in accordance with an embodiment.

FIG. 3 is a timing diagram illustrating an operation of the BLSA circuit 200 shown in FIG. 2A in accordance with an embodiment. The operation of the BLSA circuit 200 will be described with reference to FIGS. 2A to 2C, 3, and 4.

Referring to FIG. 3, the operation of the BLSA circuit 200 may include a precharge operation 310, an offset canceling operation 320, a charge sharing operation 330, and an amplification operation 340, which are sequentially performed.

During the precharge operation 310, the equalizing signal EQ, the isolation signal ISO, and the offset canceling signal OC may be enabled, and the first and second pull-up voltage supply signals SAP1 and SAP2 and the pull-down voltage supply signal SAN may be disabled. By the enabled equalizing signal EQ, the NMOS transistors 281 to 283 of the precharge circuit 280 in FIG. 2B may be turned on, and the NMOS transistors 293 to 295 of the BLSA driving circuit 290 in FIG. 2C may be turned on.

In the BLSA circuit 200 shown in FIG. 2A, the first and second isolation switches 251 and 252 may be turned on in response to the enabled isolation signal ISO, and the first and second offset canceling switches 241 and 242 may be turned on in response to the enabled offset canceling signal OC. Accordingly, during the precharge operation 310, the bit line precharge voltage VBLP may be applied to the first inner bit line IT, the second inner bit line IB, the first bit line BLT, the second bit line BLB, the first sensing node GT, and the second sensing node GB, and thus all of the bit lines and sensing nodes are precharged with the same voltage level, i.e., the level of the bit line precharge voltage VBLP. At this time, since the pull-up voltage terminal RTO and the pull-down voltage terminal SB are also at the same level, i.e., at the level of the bit line sense voltage VBLP, the first and second inverters 210 and 220 of the BLSA circuit 200 may be deactivated.

During the offset canceling operation 320 following the precharge operation 310, the equalizing signal EQ and the isolation signal ISO may be disabled, the offset canceling signal OC may maintain the enabled state, and the first pull-up voltage supply signal SAP1 and the pull-down voltage supply signal SAN may be enabled. As the NMOS transistors 291 and 296 are turned on in response to the first pull-up voltage supply signal SAP1 and the pull-down voltage supply signal SAN that are enabled, respectively, the power supply voltage VDD may be supplied to the pull-up voltage terminal RTO and the ground voltage may be supplied to the pull-down voltage terminal SB, thereby activating the first and second inverters 210 and 220. During the offset canceling operation 320, the first and second offset canceling switches 241 and 242 may be still turned on in response to the enabled offset canceling signal OC.

Figure 4:
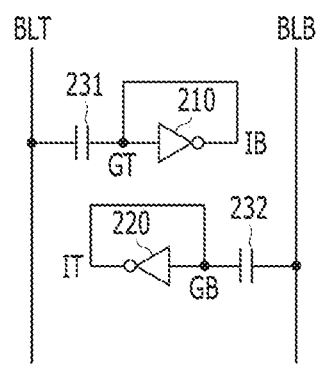
FIG. 4 illustrates a coupling state of the BLSA circuit shown in FIG. 2A during an offset canceling operation.

FIG. 4 illustrates a coupling state of the BLSA circuit 200 shown in FIG. 2A during the offset canceling operation 320. During the offset canceling operation 320, as illustrated in FIG. 4, the input and output terminals GT and IB of the first inverter 210 may be coupled to each other, and the first capacitor 231 may be coupled between the input terminal GT of the first inverter 210 and the first bit line BLT. Furthermore, the input and output terminals GB and IT of the second inverter 220 may be coupled to each other, and the second capacitor 232 may be coupled between the input terminal GB of the second inverter 220 and the second bit line BLB.

Since the input and output terminals GT and IB of the first inverter 210 may be all coupled to the first capacitor 231 during the offset canceling operation 320, a kind of equilibrium state into which the offsets of the PMOS and NMOS transistors 211 and 212 within the first inverter 210 are reflected may be stored in the first capacitor 231. Furthermore, since the input and output terminals GB and IT of the second inverter 220 may be all coupled to the second capacitor 232, a kind of equilibrium state into which the offsets of the PMOS and NMOS transistors 221 and 222 within the second inverter 220 are reflected may be stored in the second capacitor 232.

During the charge sharing operation 330 following the offset canceling operation 320, the zeroth word line WL0 may be selected and thus enabled, and the signals EQ, ISO, OC, SAN, SAP1, and SAP2 may be all disabled. The charge sharing operation 330 may be performed while charges stored in the capacitor C21 of the memory cell CELL21 may flow into the first bit line BLT through the channel of the cell transistor T21 of the memory cell CELL21 coupled to the zeroth word line WL0. Through the charge sharing operation 330, a voltage level of the first bit line BLT may become slightly higher or lower than a voltage level of the second bit line BLB that has the level of the bit line precharge voltage VBLP, according to a logic value of data stored in the memory cell CELL21. In the above description, it is exemplified that the zeroth word line WL0 is selected to perform the charge sharing operation 330 in which the data of the memory cell CELL21 is read out to the first bit line BLT. However, the first word line WL1 may be selected and thus enabled to perform a charge sharing operation in which data of the memory cell CELL22 is read out to the second bit line BLB.

During the charge sharing operation 330, the first pull-up voltage supply signal SAP1 and the pull-down voltage supply signal SAN may be disabled again, and thus the first and second inverters 210 and 220 are deactivated.

During the amplification operation 340 following the charge sharing operation 330, the isolation signal ISO may be enabled again, and thus the first and second isolation switches 251 and 252 may be turned on to couple the first bit line BLT with the first inner bit line IT and to couple the second bit line BLB with the second inner bit line IB. After the isolation signal ISO is enabled, the first pull-up voltage supply signal SAP1 and the pull-down voltage supply signal SAN may be enabled again to apply the power supply voltage VDD to the pull-up voltage terminal RTO and to apply the ground voltage to the pull-down voltage terminal SB, and thus the first and second inverters 210 and 220 may be activated again.

Accordingly, a voltage difference between the first and second bit lines BLT and BLB may be amplified by the first and second inverters 210 and 220. Since the amplification operation 340 is performed while the voltages into which the offsets of the first and second inverters 210 and 220 are reflected are stored in the first and second capacitors 231 and 232, the BLSA circuit 200 may perform the amplification operation 340 with high precision. That is, the offset voltage for guaranteeing the precise amplification operation of the BLSA circuit 200 may be reduced. When a predetermined time passes after the amplification operation 340 started, the first pull-up voltage supply signal SAP1 may be disabled, and then the second pull-up voltage supply signal SAP2 may be enabled.

Accordingly, the first and second inverters 210 and 220 may perform the amplification operation 340 using the core voltage VCORE and the ground voltage. The core voltage VCORE may have a lower voltage level than the power supply voltage VDD. That is, in the amplification operation 340, the BLSA circuit 200 is driven by a first power supply voltage, e.g., the power supply voltage VDD, during a first time period, and driven by a second power supply voltage, e.g., the core voltage VCORE, during a second time period following the first time period.

Figure 5:
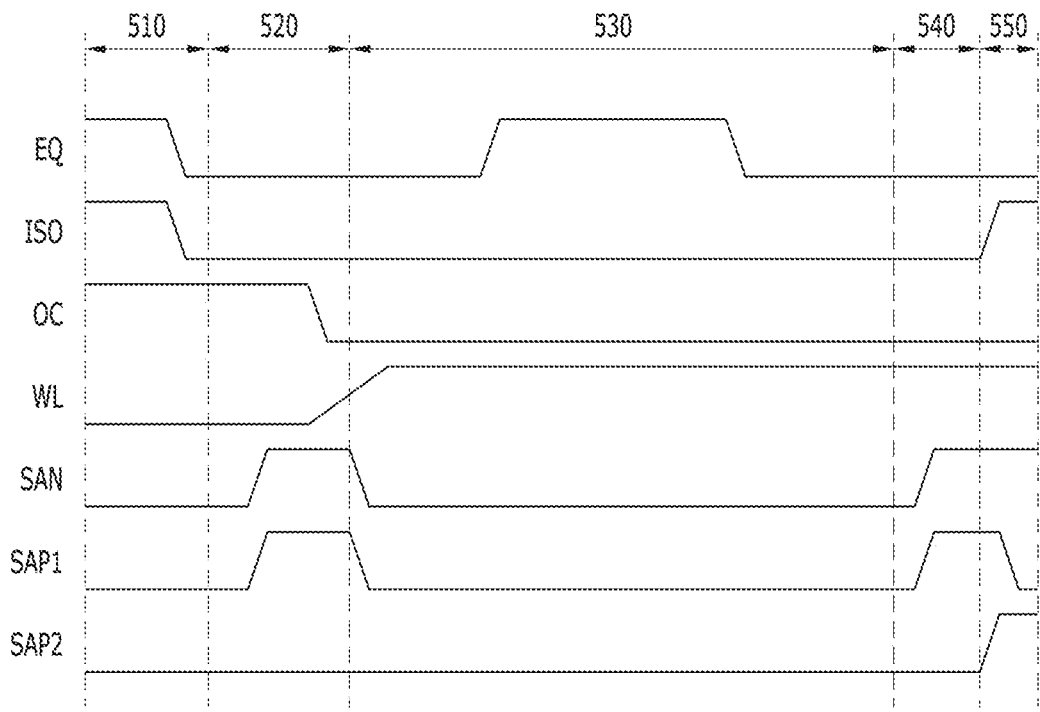
FIG. 5 is a timing diagram illustrating the operation of the BLSA circuit shown in FIG. 2A in accordance with another embodiment.

FIG. 5 is a timing diagram illustrating the operation of the BLSA circuit 200 shown in FIG. 2A in accordance with another embodiment. The operation of the BLSA circuit 200 will be described with reference to FIGS. 2A to 2C, 5, and 6.

Referring to FIG. 5, the operation of the BLSA circuit 200 may include a precharge operation 510, an offset canceling operation 520, a charge sharing operation 530, a pre-amplification operation 540, and an amplification operation 550, which are sequentially performed.

The precharge operation 510 and the offset canceling operation 520 may be performed in the same manner as the precharge operation 310 and the offset canceling operation 320 of FIG. 3.

The charge sharing operation 530 may be basically performed in the same manner as the charge sharing operation 330 of FIG. 3, but it is different from the charge sharing operation 330 in that a period in which the equalizing signal EQ is enabled is present in the charge sharing operation 530. When the equalizing signal EQ is enabled during the charge sharing operation 530, the bit line precharge voltage VBLP may be applied to the first and second inner bit lines IT and IB. As the bit line precharge voltage VBLP is applied to the first and second inner bit lines IT and IB, the voltage levels of the first and second inner bit lines IT and IB, which have been changed by the offset canceling operation 520, may return to the level of the bit line precharge voltage VBLP.

During the pre-amplification operation 540, since the signals EQ, ISO, and OC may be disabled and the first pull-up voltage supply signal SAP1 and the pull-down voltage supply signal SAN may be enabled, the switches 241, 242, 251, and 252 may be turned off and the first and second inverters 210 and 220 may be activated.

Figure 6:
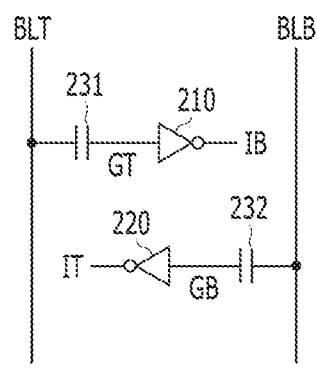
FIG. 6 illustrates a coupling state of the BLSA circuit shown in FIG. 2A during a pre-amplification operation.

FIG. 6 illustrates a coupling state of the BLSA circuit 200 shown in FIG. 2A during the pre-amplification operation 540.

Referring to FIG. 6, the first inverter 210 may amplify and invert a voltage level of the first sensing node GT to drive the second inner bit line IB, and the second inverter 220 may amplify and invert a voltage level of the second sensing node GB to drive the first inner bit line IT.

The amplification operation 550 may be performed to follow the pre-amplification operation 540. During the amplification operation 550, the second pull-up voltage supply signal SAP2 may be enabled instead of the first pull-up voltage supply signal SAP1, and the isolation signal ISO may be enabled. Since the second pull-up voltage supply signal SAP2 is enabled, the first and second inverters 210 and 220 may operate using the core voltage VCORE instead of the power supply voltage VDD during the amplification operation 550. Since the isolation signal ISO is enabled, the first and second isolation switches 251 and 252 may be turned on to thereby electrically couple the first bit line BLT with the first inner bit line IT and electrically couple the second bit line BLB with the second inner bit line IB. That is, during the amplification operation 550, the first and second inverters 210 and 220 may amplify the voltage difference between the first and second bit lines BLT and BLB using the core voltage VCORE.

Referring to FIG. 5, the first and second sensing nodes GT and GB may be first sensed and thus the first and second inner bit lines IT and IB may be first amplified during the pre-amplification operation 540. During the amplification operation 550 following the pre-amplification operation 540, the first inner bit line IT and the first bit line BLT may be electrically coupled to each other, and the second inner bit line IB and the second bit line BLB may be electrically coupled to each other, in order to continuously perform the pre-amplification operation 540 and the amplification operation 550. Therefore, a bit line amplification operation can be performed with more precision.

In accordance with the embodiments of the present disclosure, the offset voltage of the BLSA circuit 200 can be reduced.

Although various embodiments have been described for illustrative purposes, it will be apparent to those skilled in the art that various changes and modifications may be made without departing from the spirit and scope of the invention as defined in the following claims.

What is claimed is:

1. A bit line sense amplifier (BLSA) circuit comprising:
a first inverter having an input terminal coupled to a first sensing node and an output terminal coupled to a second inner bit line;
a second inverter having an input terminal coupled to a second sensing node and an output terminal coupled to a first inner bit line;
a first capacitor coupled to and disposed between a first bit line and the first sensing node;
a second capacitor coupled to and disposed between a second bit line and the second sensing node;
a first offset canceling switch suitable for electrically coupling the first inner bit line with the second sensing node during an offset canceling operation;
a second offset canceling switch suitable for electrically coupling the second inner bit line with the first sensing node during the offset canceling operation;
a first isolation switch suitable for electrically coupling the first bit line with the first inner bit line; and
a second isolation switch suitable for electrically coupling the second bit line with the second inner bit line,
wherein the BLSA circuit sequentially performs a precharge operation, the offset canceling operation, a charge sharing operation, and an amplification operation, and
wherein during the offset canceling operation, the first and second inverters are activated, the first and second offset canceling switches are turned on, and the first and second isolation switches are turned off.

2. The BLSA circuit of claim 1, wherein during the precharge operation, the first inner bit line, the second inner bit line, the first bit line, the second bit line, the first sensing node, and the second sensing node are precharged with a same voltage level.

3. The BLSA circuit of claim 1, wherein during the precharge operation, the first and second inverters are deactivated, and the first and second offset canceling switches and the first and second isolation switches are turned on.

4. The BLSA circuit of claim 3, wherein during the precharge operation, a bit line precharge voltage is applied to pull-up voltage supply terminals and pull-down voltage supply terminals of the first and second inverters, and applied to the first and second inner bit lines.

5. The BLSA circuit of claim 1, wherein the BLSA circuit is driven by a first power supply voltage during the offset canceling operation and a first time period of a pre-amplification operation, and driven by a second power supply voltage during a second time period of the amplification operation, the second time period following the first time period, the first power supply voltage having a higher voltage level than the second power supply voltage.

6. A bit line sense amplifier (BLSA) circuit comprising:
a first inverter having an input terminal coupled to a first sensing node and an output terminal coupled to a second inner bit line;
a second inverter having an input terminal coupled to a second sensing node and an output terminal coupled to a first inner bit line;
a first capacitor coupled to and disposed between a first bit line and the first sensing node;
a second capacitor coupled to and disposed between a second bit line and the second sensing node;

a first offset canceling switch suitable for electrically coupling the first inner bit line with the second sensing node during an offset canceling operation;
a second offset canceling switch suitable for electrically coupling the second inner bit line with the first sensing node during the offset canceling operation;
a first isolation switch suitable for electrically coupling the first bit line with the first inner bit line; and
a second isolation switch suitable for electrically coupling the second bit line with the second inner bit line,
wherein the BLSA circuit sequentially performs a precharge operation, the offset canceling operation, a charge sharing operation, and an amplification operation, and
wherein during the charge sharing operation, the first and second inverters are activated, and charge sharing is performed between a selected memory cell and one of the first and second bit lines to which the selected memory cell is coupled, when the first and second offset canceling switches and the first and second isolation switches are being turned off.

7. A bit line sense amplifier (BLSA) circuit comprising:
a first inverter having an input terminal coupled to a first sensing node and an output terminal coupled to a second inner bit line;
a second inverter having an input terminal coupled to a second sensing node and an output terminal coupled to a first inner bit line;
a first capacitor coupled to and disposed between a first bit line and the first sensing node;
a second capacitor coupled to and disposed between a second bit line and the second sensing node;
a first offset canceling switch suitable for electrically coupling the first inner bit line with the second sensing node during an offset canceling operation;
a second offset canceling switch suitable for electrically coupling the second inner bit line with the first sensing node during the offset canceling operation;
a first isolation switch suitable for electrically coupling the first bit line with the first inner bit line; and
a second isolation switch suitable for electrically coupling the second bit line with the second inner bit line,
wherein the BLSA circuit sequentially performs a precharge operation, the offset canceling operation, a charge sharing operation, and an amplification operation, and
wherein during the amplification operation, the first and second inverters are activated, the first and second isolation switches are turned on, and the first and second offset canceling switches are turned off.

8. A bit line sense amplifier (BLSA) circuit comprising:
a first inverter having an input terminal coupled to a first sensing node and an output terminal coupled to a second inner bit line;
a second inverter having an input terminal coupled to a second sensing node and an output terminal coupled to a first inner bit line;
a first capacitor coupled to and disposed between a first bit line and the first sensing node;
a second capacitor coupled to and disposed between a second bit line and the second sensing node;
a first offset canceling switch suitable for electrically coupling the first inner bit line with the second sensing node during an offset canceling operation;
a second offset canceling switch suitable for electrically coupling the second inner bit line with the first sensing node during the offset canceling operation;
a first isolation switch suitable for electrically coupling the first bit line with the first inner bit line; and
a second isolation switch suitable for electrically coupling the second bit line with the second inner bit line,
wherein the BLSA circuit sequentially performs a precharge operation, the offset canceling operation, a charge sharing operation, a pre-amplification operation, and an amplification operation.

9. The BLSA circuit of claim 8, wherein during the precharge operation, the first inner bit line, the second inner bit line, the first bit line, the second bit line, the first sensing node, and the second sensing node are precharged with a same voltage level.

10. The BLSA circuit of claim 8, wherein during the precharge operation, the first and second inverters are deactivated, and the first and second offset canceling switches and the first and second isolation switches are turned on.

11. The BLSA circuit of claim 10, wherein during the precharge operation, a bit line precharge voltage is applied to pull-up voltage supply terminals and pull-down voltage supply terminals of the first and second inverters, and applied to the first and second inner bit lines.

12. The BLSA circuit of claim 8, wherein during the offset canceling operation, the first and second inverters are activated, the first and second offset canceling switches are turned on, and the first and second isolation switches are turned off.

13. The BLSA circuit of claim 8, wherein during the charge sharing operation, the first and second inverters are deactivated, and charge sharing is performed between a selected memory cell and one of the first and second bit lines to which the selected memory cell is coupled, when the first and second offset canceling switches and the first and second isolation switches are being turned off, and
wherein, during a predetermined period of the charge sharing operation, a bit line precharge voltage is applied to the first and second inner bit lines.

14. The BLSA circuit of claim 8, wherein during the pre-amplification operation, the first and second inverters are activated, and the first and second offset canceling switches and the first and second isolation switches are turned off.

15. The BLSA circuit of claim 8, wherein during the amplification operation, the first and second inverters are activated, the first and second offset canceling switches are turned off, and the first and second isolation switches are turned on.

16. The BLSA circuit of claim 8, wherein the BLSA circuit is driven by a first power supply voltage during the offset canceling operation and the pre-amplification operation, and driven by a second power supply voltage during the amplification operation, the first power supply voltage having a higher voltage level than the second power supply voltage.

* * * * *